(12) United States Patent
Juds et al.

(10) Patent No.: US 9,389,246 B2
(45) Date of Patent: Jul. 12, 2016

(54) MULTIPLE LAYER CAPACITOR DIVIDER VOLTAGE SENSORS SUITABLE FOR CIRCUIT BREAKERS AND RELATED CIRCUIT BREAKERS

(71) Applicant: Eaton Corporation, Cleveland, OH (US)

(72) Inventors: Mark Allan Juds, New Berlin, WI (US); Kurt von Eckroth, Wales, WI (US); John Trublowski, Troy, MI (US); Naresh Kumar Kodela, Pune (IN)

(73) Assignee: Eaton Corporation, Cleveland, OH (US)

( * ) Notice: Subject to any disclaimer, the term of this patent is extended or adjusted under 35 U.S.C. 154(b) by 220 days.

(21) Appl. No.: 14/150,140

(22) Filed: Jan. 8, 2014

(65) Prior Publication Data

US 2015/0192618 A1      Jul. 9, 2015

(51) Int. Cl.
*G01R 15/06*     (2006.01)
*G01R 15/16*     (2006.01)
*H01G 4/30*     (2006.01)

(52) U.S. Cl.
CPC ............... *G01R 15/06* (2013.01); *G01R 15/16* (2013.01); *H01G 4/30* (2013.01); *H01G 4/306* (2013.01)

(58) Field of Classification Search
CPC . H03H 9/6483; H03H 9/02275; G01R 15/06; G01R 15/16; G01R 27/2605; G01R 29/0878
See application file for complete search history.

(56) References Cited

U.S. PATENT DOCUMENTS

| | | | |
|---|---|---|---|
| 5,017,859 A | 5/1991 | Engel et al. | |
| 5,291,642 A | 3/1994 | Pageaud et al. | |
| 5,600,254 A * | 2/1997 | Berberich | B60S 1/0818 318/DIG. 2 |
| 5,734,263 A | 3/1998 | Ryczek et al. | |

(Continued)

FOREIGN PATENT DOCUMENTS

| | | |
|---|---|---|
| JP | 2012137359 | 7/2012 |
| WO | WO2012/056304 | 5/2012 |
| WO | WO2013/042155 | 3/2013 |

OTHER PUBLICATIONS

International Search Report and Written Opinion for corresponding PCT Application No. PCT/US2014/072505, date of mailing Mar. 12, 2015, 10 pages.

*Primary Examiner* — Tung X Nguyen
*Assistant Examiner* — Alesa Allgood
(74) *Attorney, Agent, or Firm* — Myers Bigel & Sibley, P.A.

(57) ABSTRACT

Multi-layer capacitor divider voltage sensors include a plurality of voltage sensor conductive layers having sensor to ground interface surfaces. Respective voltage sensor conductive layers are connected to each other and sensor output voltage Vs by continuations of material forming the interface surfaces extending therebetween. The voltage sensors also include a plurality of conductive ground layers connected to electrical ground, the ground layers interleaved with the voltage sensor conductive layers so that a conductive ground layer resides between adjacent conductive voltage sensor layers. A first voltage sensor conductive layer (closest to a line conductor) is electrically connected to the other conductive voltage sensor layers and output voltage Vs and has a sensor to conductor interface surface with a corresponding interface area. The interface areas and the gap distances are configured to provide desired capacitance for attenuation of conductor voltage Vc for a suitably sized Vs in a compact sensor package.

18 Claims, 9 Drawing Sheets

(56) References Cited

U.S. PATENT DOCUMENTS

| | | |
|---|---|---|
| 7,253,630 B1 | 8/2007 | Zhou et al. |
| 8,163,574 B2 | 4/2012 | Juds et al. |
| 8,278,947 B2 | 10/2012 | Moliton et al. |
| 2005/0264978 A1 | 12/2005 | Scheidegger et al. |
| 2006/0284639 A1* | 12/2006 | Reynolds ............ G01D 5/24 324/688 |
| 2010/0156441 A1* | 6/2010 | Moliton ............ G01R 15/06 324/681 |
| 2012/0098519 A1 | 4/2012 | Juds et al. |
| 2014/0194241 A1* | 7/2014 | Stotz ............ F16H 1/32 475/162 |

* cited by examiner

MULTIPLE LAYER CAPACITOR DIVIDER VOLTAGE SENSORS SUITABLE FOR CIRCUIT BREAKERS AND RELATED CIRCUIT BREAKERS

FIELD OF THE INVENTION

The present invention relates generally to voltage sensors for use with line conductors and, more particularly, to compact capacitive divider-type voltage sensors.

BACKGROUND OF THE INVENTION

Figure 1:
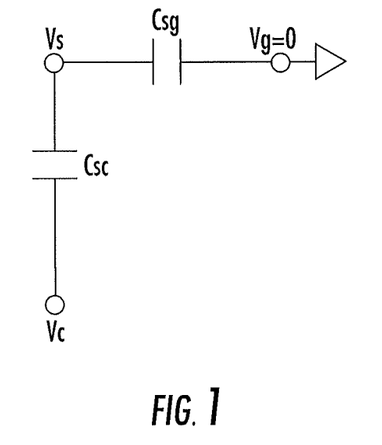
FIG. 1 is a schematic illustration of a capacitor divider voltage sensor configuration.

Capacitive divider-type sensors measure the AC voltage of a line conductor or bus bar. FIG. 1 schematically illustrates a capacitor divider voltage sensor circuit. The circuit includes a capacitor Csg between the voltage sensor Vs and electrical ground Vg. The circuit also includes a second capacitor Csc between the voltage sensor Vs and the line conductor or bus bar Vc. The sensor voltage Vs is a (small) ratio of the conductor voltage Vc. The voltage ratio is a linear function of the capacitors Csc and Csg. The voltage ratio "Vc/Vs" and scale factor "Vs/Vc" can be determined using the following equations:

$$Vc/Vs = 1 + Csg/Csc \qquad \text{Voltage Ratio}$$

$$Vs/Vc = Csc/(Csc+Csg) \qquad \text{Scale Factor}$$

Design considerations for voltage sensors include cost, size and ease of manufacture. Also, the electric field (E-field) concentration on individual components of the capacitive divider can influence the design of the capacitive divider. As is known, E-field concentration is, in part, a factor of the voltage of the line conductor. That is, as the voltage of the line conductor increases, E-field concentration on the individual components of the capacitive divider may increase as well. When E-field concentration is high, dielectric breakdown may occur between the line conductor and the voltage sensor. While E-field concentration may be minimized by increasing the distance between individual components of the capacitive divider, such an increase in component spacing also increases the overall size of the device.

SUMMARY OF EMBODIMENTS OF THE INVENTION

Embodiments of the invention are directed to apparatus and methods for measuring the voltage that can be small and relatively inexpensive to manufacture.

Some embodiments are directed to capacitor divider voltage sensors that include: (a): a plurality of voltage sensor conductive layers having sensor to ground interface surfaces, wherein respective voltage sensor conductive layers are electrically connected to each other and a sensor output voltage Vs; and (b) a plurality of conductive ground layers connected to electrical ground, the conductive ground layers interleaved with the voltage sensor conductive layers so that a ground layer resides between adjacent voltage sensor conductive layers. The plurality of voltage sensor conductive layers with the sensor to ground interfaces includes a first voltage sensor layer that is closest to a line conductor. The first voltage sensor layer has a sensor to conductor interface surface facing the line conductor with a corresponding interface area and also has the sensor to ground interface on an opposing primary surface. The first voltage sensor layer is separated from the line conductor by at least one dielectric or insulating material to reside a distance "gsc" away from the line conductor. The voltage sensor defines a first capacitor "Csc" with capacitance from the voltage sensor to line conductor being proportional to the area of the interface surface between the first voltage sensor layer and the conductor and being inversely proportional to "gsc". Each voltage sensor layer with the sensor to ground interface surface has a respective area and resides a distance "gsg" from a neighboring ground layer. The voltage sensor defines a second capacitor "Csg" with capacitance from the voltage sensor to ground being proportional to the area of the sensor layer to ground interface surfaces and the number of conductive layers with respective sensor to ground interface surfaces and is inversely proportional to "gsg".

Respective voltage sensor conductive layers can be electrically connected to each other and a sensor output voltage Vs by continuations of material forming the interface surfaces (and can, in some embodiments, have the same width and height).

The voltage sensor can have the same number of ground and voltage sensor layers forming sensor to ground interface surfaces.

The voltage sensor can be configured so that an outer layer is a ground layer to thereby shield the sensor from external electric fields.

The voltage sensor can be configured so that the continuations of material of respective ground and voltage sensor layers are orthogonal to the sensor to ground interface surfaces.

The continuations of material and the voltage sensor layers with the sensor to ground interfaces can have a common length dimension.

The first sensor layer can have a sensor to conductor interface surface with a corresponding surface area that is between about 1 $mm^2$ to about 1000 $mm^2$ but larger and smaller interface surface areas are contemplated by embodiments of the invention.

The conductive sensor and ground layers can be defined by a continuous length of a flexible substrate with opposing first and second conductive surfaces separated by a dielectric film, the first conductive surface forming the voltage sensor conductive layers and the second conductive surface forming the conductive ground layers.

The conductive sensor and ground layers can be defined by a flexible substrate with opposing first and second conductive surfaces separated by a dielectric film, the first conductive surface forming the voltage sensor conductive layers and the second conductive surface forming the conductive ground layers. The film thickness can define the distance gsg between adjacent conductive voltage sensor and conductor layers.

The flexible substrate can be folded into a plurality of closely spaced apart stacked sections.

The flexible substrate can have a body with a serpentine or undulation shape, the extensions defined by bends associated with the folds. The flexible substrate can hold an electronic circuit with an amplifier to amplify sensor voltage Vs from the voltage sensor.

At least one region of the flexible substrate can have increased rigidity with respect to other regions and holds the electronic circuit.

The conductive sensor and ground layers can be defined by a flexible substrate with opposing first and second conductive surfaces, the first conductive surface forming the voltage sensor conductive layers and the second conductive surface forming the ground layers. The flexible substrate can have a rolled or wound body capacitor divider configuration with a spiral cylindrical shape or an oval shape.

The first voltage sensor layer can have a planar conductor to voltage sensor interface surface.

The first voltage sensor layer can have a curved conductor to sensor interface surface.

The flexible substrate can include at least four layers in a defined order of, an outer dielectric layer, the conductive sensor layer, a second dielectric film, and the conductive ground layer.

Still other embodiments are directed to multi-phase capacitor divider voltage sensors. The sensors include a plurality of multi-layer voltage sensors, each multi-layer voltage sensor having (i) interleaved conductive sensor and ground layers configured to have a first conductive voltage sensor layer that faces a respective line conductor and is electrically connected to the other voltage sensor layers and (ii) an outer conductive ground layer. The outer ground layer of each of the multi-layer sensors is electrically connected to a common reference node.

The plurality of multi-layer voltage sensors can include first, second and third multi-layer voltage sensors, each connected to a different phase conductor.

The sensor may include a conductive plate, PCB or flex circuit or wire that electrically connects the outer ground layer of the plurality of multi-layer voltage sensors.

The outer conductive ground layers can be electrically connected at a neutral polarity to define a synthesized neutral.

Yet other embodiments are directed to circuits for a low or medium voltage switchgear. The circuits include one or more of the following capacitor divider voltage sensor configurations identified by (i), (ii), (iii) and (iv) listed below.

(i) A capacitor divider voltage sensor, comprising: a plurality of voltage sensor conductive layers having sensor to ground interface surfaces, wherein respective voltage sensor conductive layers are electrically (typically also physically) connected (typically by continuations of material forming the interface surfaces extending therebetween); and a plurality of conductive ground layers, the ground layers interleaved with the voltage sensor conductive layers so that a ground layer resides between adjacent voltage sensor conductive layers. The plurality of voltage sensor conductive layers with the sensor to ground interfaces includes a first voltage sensor layer that is closest to a line conductor and is electrically connected to sensor output Vs, the first sensor layer has a sensor to conductor interface surface with a corresponding interface area, wherein the first voltage sensor layer is separated from the line conductor by at least one dielectric or insulating material to reside a distance "gsc" away from the line conductor. The voltage sensor defines a first capacitor "Csc" with capacitance from the voltage sensor to conductor being proportional to an area of the interface surface between the first voltage sensor layer and the conductor and being inversely proportional to "gsc". Each voltage sensor layer with respective sensor to ground interface surface resides a distance "gsg" from a neighboring ground layer, wherein capacitance from the voltage sensor to ground "Csg" is proportional to the area of the interface surfaces and the number of conductive layers with sensor to ground interface surfaces and is inversely proportional to "gsg". The voltage sensor is configured so that an outer layer is a ground layer connected to Vg to thereby shield the sensor from external electric fields.

(ii) A capacitor divider voltage sensor having a flexible substrate body with a length that is folded a plurality of times and defines spaced apart conductive sensor and ground layers separated by a dielectric film. The voltage sensor is configured so that a first conductive sensor layer faces a respective line conductor and is electrically connected to sensor output Vs.

(iii) a capacitor divider voltage sensor having a flexible substrate body with a length that is rolled or wound to form a substantially cylindrical or substantially oval body with stacked conductive sensor and ground layers separated by a dielectric film. The sensor is configured so that a first conductive sensor layer faces a respective line conductor and is electrically connected to sensor output Vs.

(iv) A plurality of multi-layer voltage sensors, each multi-layer voltage sensor having (i) interleaved conductive voltage sensor and ground layers configured to have a first conductive voltage sensor layer that faces a respective line conductor and is electrically connected to the other voltage sensor layers and (ii) an outer conductive ground layer. The outer conductive ground layers of each of the multi-layer sensors are electrically connected at a common reference node.

Other embodiments are directed to methods of fabricating a capacitor for a capacitor voltage sensor. The methods include: (a) providing a plurality of rolls of material including rolls of conductive material and rolls of electrically insulating material; (b) pulling and compressing the material from the different rolls together into abutting overlying layers; and (c) forming a capacitor with a shaped body for a capacitor sensor divider using a length of the abutting layers.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

DETAILED DESCRIPTION OF EMBODIMENTS OF THE INVENTION

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly. The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

The term "printed circuit board" refers to a substrate with electrical paths and components thereon. The substrate can be flexible, rigid or semi-rigid. The term "semi-rigid" refers to substrates that can flex but have sufficient rigidity to retain a desired self-supported shape and may be malleable.

The term "closely spaced apart" refers to spacing of adjacent ground and sensor layers and neighboring sensor or ground layers, which can be a distance between about 0.001 mm to about 50 mm, typically between about 0.001 mm and about 1 mm.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2A:
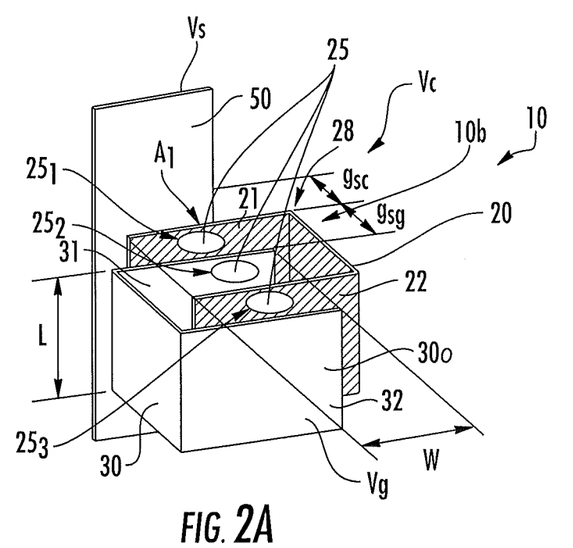
FIG. 2A is a schematic perspective enlarged view of an exemplary multi-layer voltage sensor configuration according to embodiments of the present invention.
Figure 2B:
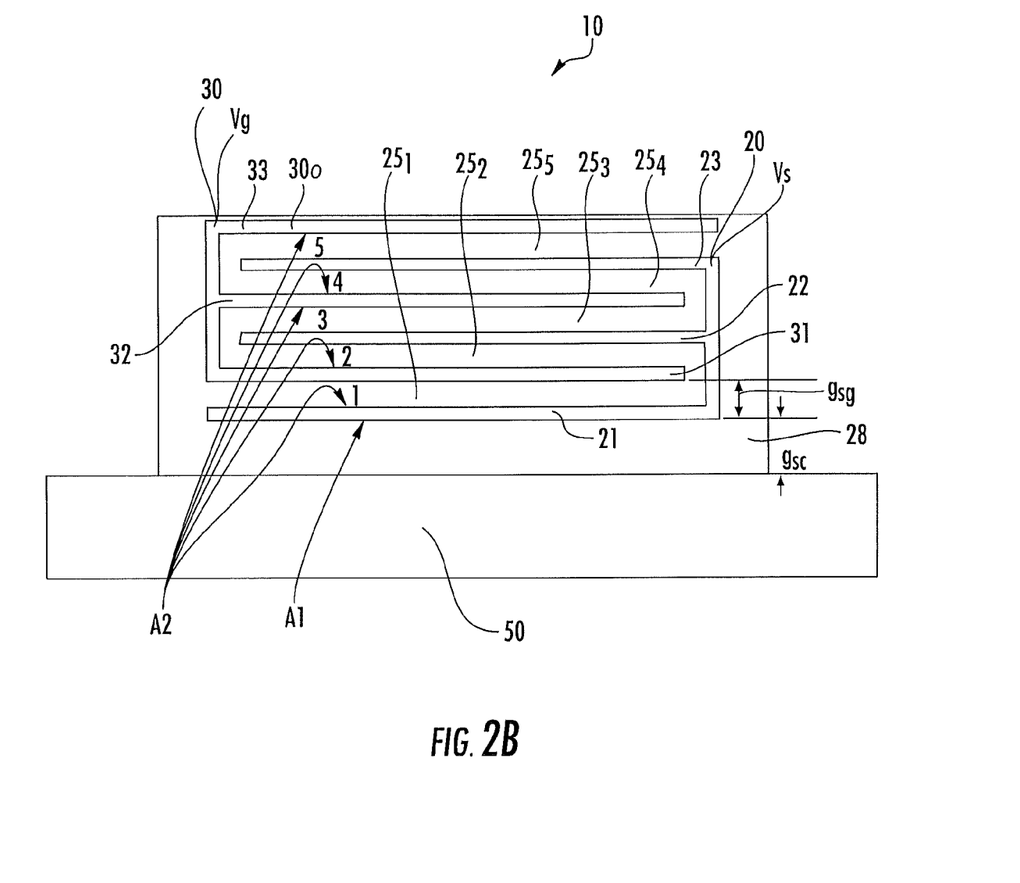
FIG. 2B is a greatly enlarged schematic top view of a multi-layer voltage sensor similar to that shown in FIG. 2A according to embodiments of the present invention.

Turning now to the figures, FIGS. 2A and 2B illustrate a capacitor divider voltage sensor 10. The voltage sensor 10 can be provided by a multiple-layer printed circuit board 10b defining interleaved conductive sensor layers 20 and ground layers 30. The ground layers are at 0 volts (Vg=0). The voltage sensor 10 includes at least one voltage sensor layer 21 22 interleaved with a respective ground layer 30. Typically, the voltage sensor 10 includes a plurality of voltage sensor layers 21, 22, interleaved with respective ground layers 31, 32. The voltage sensor layers 20 are electrically connected to each other to provide voltage sensor output Vs. The ground layers 30 are also electrically connected to each other to provide voltage output Vg (Vg=0). One of the voltage sensor layers 21 is closer to the line or current and voltage carrying conductor 50 than a corresponding ground layer 31 or other sensor layers 20.

FIG. 2A illustrates a voltage sensor 10 with two closely spaced apart sensor layers 21, 22, interleaved with respective ground layers 31, 32. FIG. 2B illustrates the voltage sensor 10 with three closely spaced apart sensor layers 21, 22, 23, interleaved with respective ground layers 31, 32, 33. An electrical insulator or dielectric material 28 can be positioned between the conductor 50 and the first sensor layer 21. The electrical insulator or dielectric material 28 can also reside between one or more of each adjacent ground layer 30 and sensor layer 20. As shown in FIG. 2B, the dielectric or electrical insulator 28 can also reside between each neighboring sensor and ground layers 20, 30.

The electrical insulator or dielectric 28 can comprise air, a thin (e.g., between about 0.002 inches to about 0.1 inches) sheet of electrical insulator material such as, for example, polyimide-FEP fluoropolymer substrates that provide a tough, high dielectric strength insulation such as Kapton® film from Dupont, or may comprise a layer of a PCB, or combinations of the above or different materials and substances.

In some embodiments, the sensor and ground layers 20, 30 of the capacitor divider sensor 10 are provided as closely stacked conductive layers of a PCB. The stacked conductive layers of the voltage sensor 10 can include between about 1-20 layers of interleaved voltage sensor and ground layers 20, 30, excluding dielectric layers, where used. The layers 20, 30 can have regular or irregular gap or electrical insulating spaces therebetween.

Each adjacent conductive layer 20, 30 can reside within about 0.001 mm to about 1 mm of each other, this distance can correspond to distance "gsg" (FIG. 2A) and influences the capacitance Csg.

The capacitance from the voltage sensor to conductor (Csc) is proportional to the interface area A1 between the sensor layer 21 and conductor 50 and inversely proportional to the gap (gsc) between the sensor layer 21 and conductor 50.

The capacitance from sensor to ground (Csg) is proportional to the interface area A2 between the respective sensor layers 20 and ground layers 30, to the number of interface layers 25 (indicated by the circles in FIGS. 2A and 3, for example) between sensor and ground and inversely proportional to the gap (gsg) between the respective sensor layers 20 and ground layers 30.

In FIG. 2A, the number of voltage sensor layer 20 having interface layers 25 with interface surfaces A2 is three $25_1$, $25_2$, $25_3$. In FIG. 2B, the number of interface layers 25 is shown as five with respective interface surfaces A2.

The interface areas A1 and A2 can have different areas. In some embodiments, A1 and/or A2 can be any appropriate size typically between about 0.0001 mm$^2$ to about 1,000,000 mm$^2$, depending on the target application.

In some embodiments, A1 and/or A2 has a surface area that is relatively compact, typically between about 1 mm$^2$ to about 1500 mm$^2$, more typically between about 1 mm$^2$ to about 1000 mm$^2$, including between about 1-9 mm$^2$, about 10 mm$^2$, about 50 mm$^2$, about 75 mm$^2$, about 100 mm$^2$, about 200 mm$^2$, about 250 mm$^2$, about 300 mm$^2$, about 350 mm$^2$, about 400 mm$^2$, about 450 mm$^2$, about 500 mm$^2$, about 600 mm$^2$, about 700 mm$^2$, about 800 mm$^2$, about 900 mm$^2$ or about 1000 mm$^2$ and any number therebetween. In some particular embodiments A1 and/or A2 can have width×height dimensions that are about 10 mm by about 10 mm, for a respective interface surface area of about 100 mm$^2$.

In some particular embodiments, for low voltage applications, the interface area A1 and/or A2 can be between about 10 mm$^2$ to about 1000 mm$^2$. For example A1 and/or A1 can be about 10 mm$^2$, about 20 mm$^2$, about 30 mm$^2$, about 40 mm$^2$, about 50 mm$^2$, about 60 mm$^2$, about 70 mm$^2$, about 80 mm$^2$, about 90 mm$^2$, about 100 mm$^2$, about 125 mm$^2$, about 150 mm$^2$, about 175 mm$^2$, about 200 mm$^2$, about 250 mm2, about 300 mm$^2$, about 350 mm$^2$, about 400 mm$^2$, about 450 mm$^2$, about 500 mm$^2$, about 600 mm$^2$, about 700 mm$^2$, about 800 mm$^2$, about 900 mm$^2$ or about 1000 mm$^2$ or any number therebetween. However, it is contemplated that other applications can use much smaller or larger interface areas. The small interface areas may be fabricated with MEMS (Micro Electro-Mechanical Systems) fabrication techniques or other miniature fabrication methods, e.g., silicon wafer micromachining, deposition of insulating and conducting layers, patterning and selective etching.

The ground to sensor interfaces 25 can be provided in different numbers, typically between about 1 to about 20, including 1, 2, 3, 4, 5, 6, 7, 8, 9, 10, 11, 12, 13, 14, 15, 16, 17, 18, 19, and 20. The ground to sensor interface areas A2 can be provided in different sizes in different interface layers.

Thus, the voltage sensor 10 can have a construction similar to a multi-layer circuit board with alternating conductive and dielectric layers. In the embodiment shown in FIG. 2A, the first and third conductive layers 21, 22 are connected to the sensor output Vs and the $2^{nd}$ and $4^{th}$ layers, 31, 32 are connected to ground (Vg).

The first conductive layer 21 nearest the conductor 50 is connected to the sensor output Vs and is spaced apart from the conductor 50 using a dielectric or electric insulator 28. The number of ground layers 30 and sensor layers 20 should be the same, so that the outer layer 30o (layer 32 in FIG. 2A and layer 33 in FIG. 2B) or the layer of the voltage sensor 10 furthest away from the conductor 50 is a ground layer 30. This configuration can shield the sensor 10 from external electric fields. Increasing the number of interface layers 25 increases the capacitance (Csg) and allows a decrease of the interface area A2 and/or an increase of the voltage ratio (Vc/Vs). Thus, the size of the voltage sensor 10 can be small.

In some embodiments, the arrangement of the conductor 50 and layers 20 and 30 can provide a capacitance Csc that is about 1 pF and a capacitance Csg that is between about 100 pF and 1000 pF.

The voltage sensor signal Vs can be between about 0.001% to about 1% of Vc. In some embodiments, the ratio between the sensed voltage signal $V_S$ and the line conductor voltage $V_C$ is 1:200 and/or about 5 mV/V.

Figure 8A:
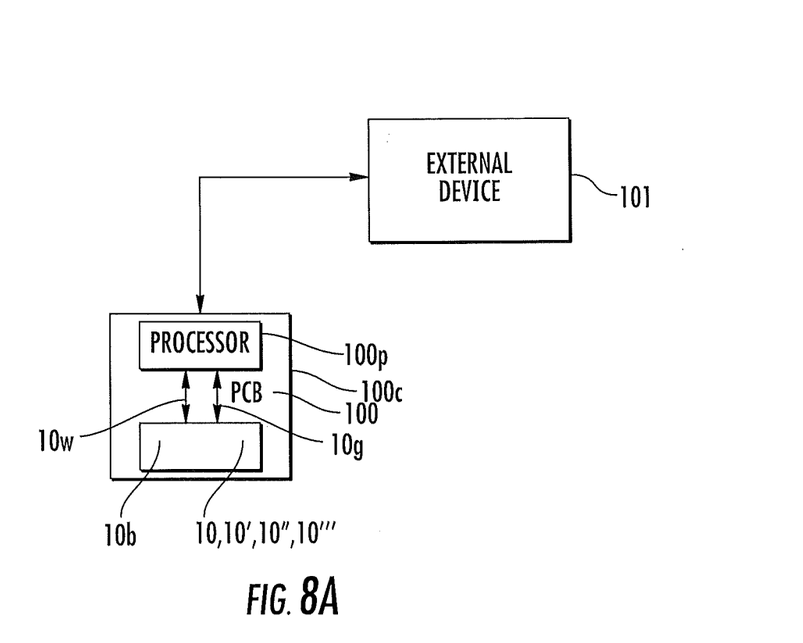
FIG. 8A is an exemplary circuit diagram that includes a PCB that can interface with the detected voltage sensor signal and interface to external devices such as an electronic trip unit and/or a protective relay according to some embodiments of the present invention.

As shown in FIG. 8A, an electric circuit 100c can be mounted on a PCB 100 that also holds the voltage sensor body 10b (or various configurations 10, 10', 10'', 10''' as will be discussed further below) to increase accuracy and reliability of the sensor signal Vs. The circuit 100c can include a processor 100p (and other components such as amplifiers) and can interface with external devices 101 such as an electronic trip unit and/or a protective relay. The circuit 100c can include a buffer and amplifier circuit with a readout circuit that can amplify a sensed voltage potential signal proportional to the sensed voltage from capacitive divider 10 and transmits a signal indicative of a voltage potential of line conductor 50 to an external device 101 such as a trip unit (not shown).

Figure 2C:
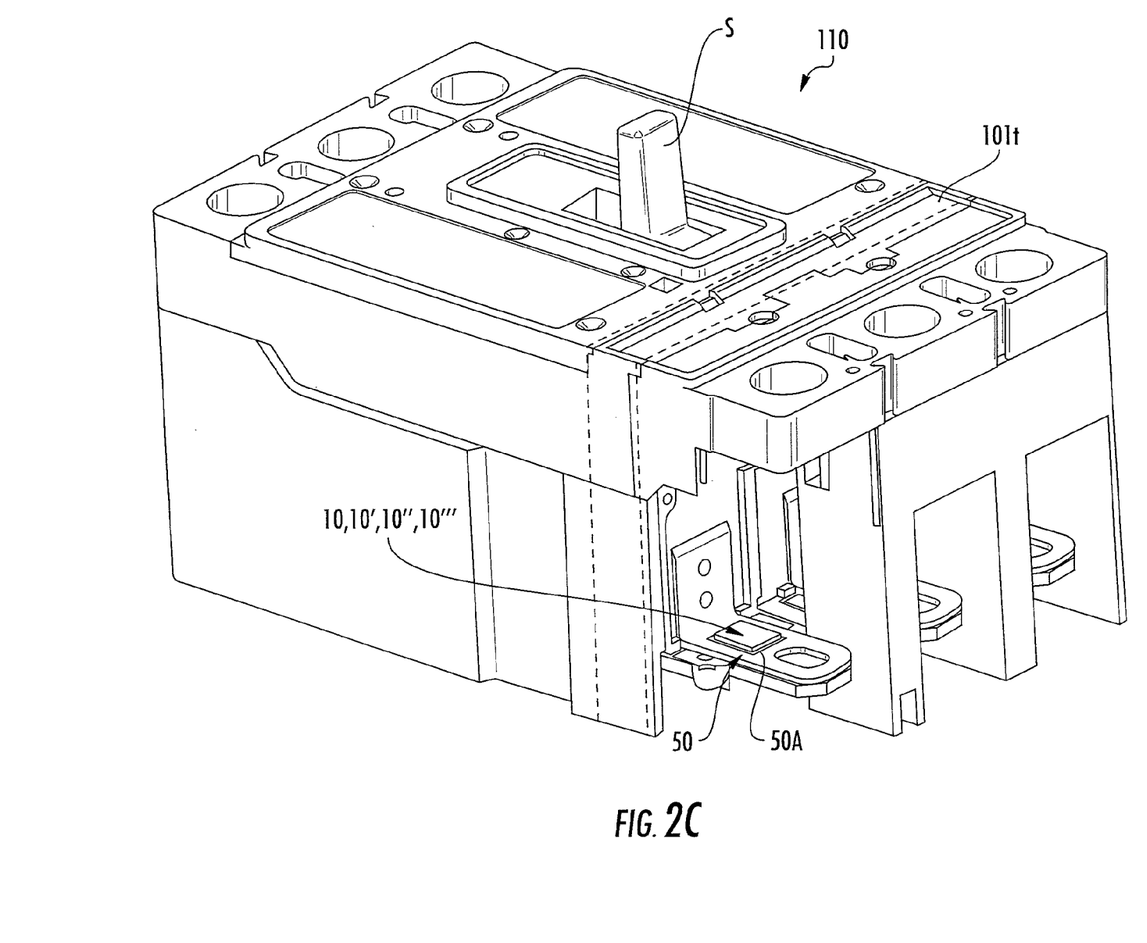
FIG. 2C is a side perspective view of an example of a molded case circuit breaker (MCCB) with a trip unit and multi-layer voltage sensor attached to a conductor of the MCCB according to embodiments of the present invention.

FIG. 2C illustrates the voltage sensor 10 in electrical communication with a conductor 50 (shown as the phase A conductor 50A) used with a trip unit 101t in a low voltage molded case circuit breaker 110 with a switch S. Further description of an example of a circuit breaker with a medium voltage applications that can incorporate the voltage sensors of this document can be found in co-pending US2012/0098519, the content of which is hereby incorporated by reference as if recited in full herein.

Figure 3:
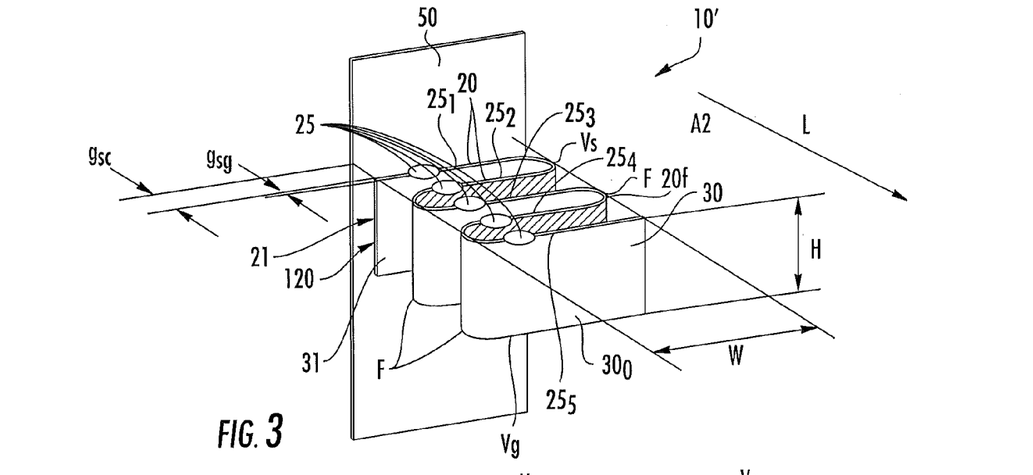
FIG. 3 is a schematic perspective enlarged view of another exemplary multi-layer voltage sensor configuration according to embodiments of the present invention.

FIG. 3 illustrates a voltage sensor 10' similar to that shown in FIGS. 2A and 2B. In this embodiment, the sensor body 10b comprises a flex circuit body 20f that can comprise folded metalized dielectric film. The flex circuit 20f can include dielectric film 120 that can be metalized on both sides forming an outer conductive sensor layer 20, an outer conductive ground layer 30 with a dielectric film layer 120 therebetween. The distance gsg is the thickness of the dielectric film 120. This distance gsg (or film 120 thickness) is typically between about 0.001 mm to about 0.1 mm.

The capacitance from sensor to conductor (Csc) is proportional to the interface area A1 and inversely proportional to the gap space gsc between the sensor layer 21 and conductor 50. The capacitance from sensor to ground (Csg) is proportional to the interface area A2 and inversely proportional to the gap gsg between the sensor and ground layers 20, 30.

Increasing the interface area A2 increases the capacitance Csg and increases the voltage ratio. A long strip of dielectric film can be metalized so that the interface area A2 is large. The film 20f can have a width W that is between about 2 mm to about 20 mm and a height H that is between about 2 mm to about 20 mm. The length L can be any suitable length, typically between about 1 mm to about 10 mm. The length can be sufficient to form between 4-100 folds to define interface areas 25, typically with an even number of folds F. As shown by way of example in FIG. 3, the folds F can produce about 5 interface areas 25, A2. The interface areas A2 in this embodiment is in the dielectric film between the metalized sides 20, 30.

The length and fold configurations can have a serpentine and/or undulated shape with folds F that can fit within a small region/volume. Therefore, the size of the voltage sensor 10' can be small and the sensor voltage Vs can be small such as less than about 7.5 V to inhibit saturation of an electronic amplifier.

An even number of folds F (shown as four) can result in the sensor layer 21 interfacing with the conductor 50 and with the outer ground layer 30o on the outside to form a shield from external electric fields. The flex circuit 20f can include a portion that is stiffened with a rigidizer or held on a rigid substrate used to hold electronic circuit amplifier components. Alternatively or additionally, the flex circuit 20f can be attached to a rigid or semi-rigid PCB.

Figure 8B:
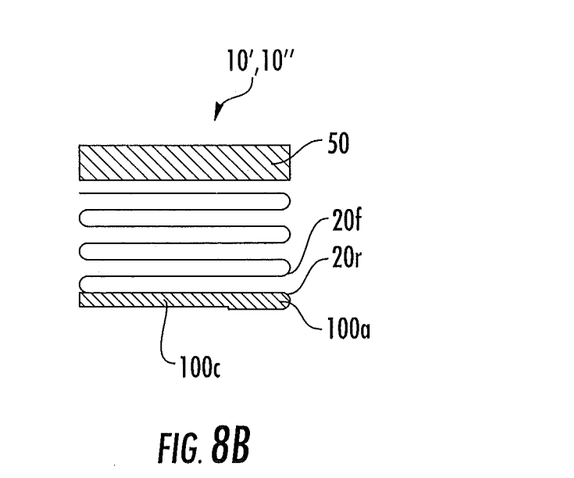
FIG. 8B is a schematic illustration of a flex circuit sensor configuration according to embodiments of the present invention.

As shown in FIG. 8B, the voltage sensor 10', 10" can be in communication with an electric circuit 100c. The circuit 100c can be mounted on a rigidized portion 20r of the flex circuit 20f to increase accuracy and reliability of the sensor signal Vs. The circuit 100c can include a processor 100p (and other components such as one or more amplifiers 100a) and can interface with external devices 101 (FIG. 8A) such as an electronic trip unit and/or a protective relay.

Figure 4A:
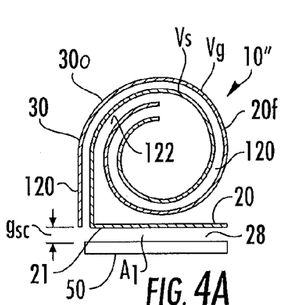
FIGS. 4A-4C and 5A-5D are schematic enlarged views of exemplary wound multi-layer voltage sensor configurations according to embodiments of the present invention.
Figure 4B:
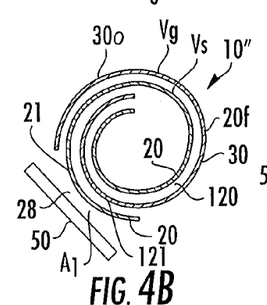
Figure 4C:
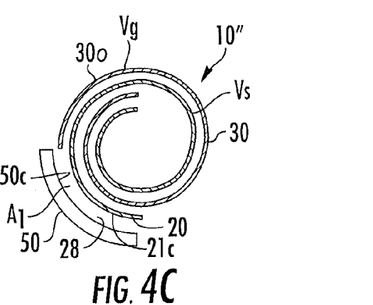
Figure 5A:
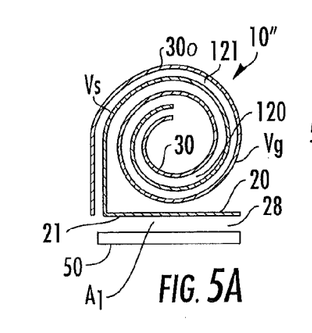
Figure 5B:
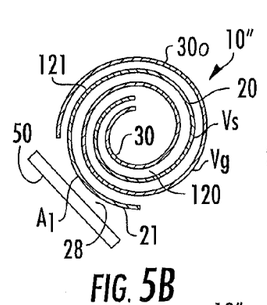
Figure 5C:
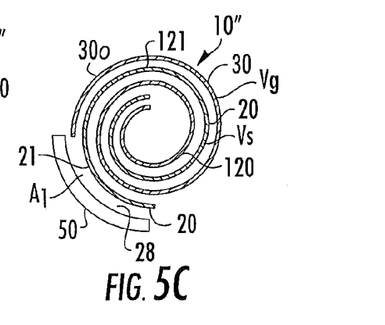
Figure 5D:
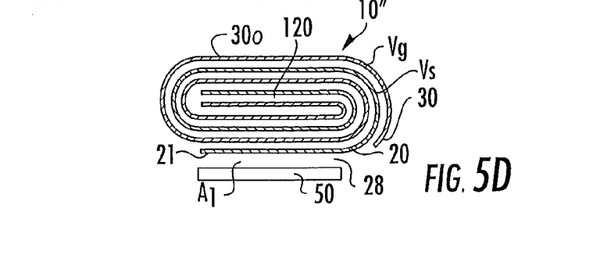

FIGS. 4A-4C and 5A-5D illustrate a wound capacitor/divider voltage sensor configuration 10". FIGS. 4A-4C and 5A-5C illustrate substantially spiral wound configurations. FIG. 5D is similar to FIG. 5A but illustrates that the capacitor forming the voltage sensor 10" can be wound in a flat configuration. This embodiment is similar to the folded flex circuit configuration shown in FIG. 3. In this embodiment, the flex circuit 20f can comprise a metalized dielectric film(s) that is rolled into a body having an oval shape (FIG. 5D) or a cylindrical shape. The flex circuit 20f can comprise four layers, including a dielectric film layer 120, a conductive sensor layer 20, and a second dielectric film layer 121 and a conductive ground layer 30. The cylindrical configurations can reduce radii associated with folding (FIG. 3) and may simplify fabrication. The inside conductive layer can be either the sensor layer 20 (shown in FIGS. 4A, 4B) or the ground layer 30 (shown in FIGS. 5A, 5B, 5D). The final outside wrap can have only the ground layer 30o to provide the electrical shielding as discussed above. FIGS. 4A, 5A and 5D illustrate a flat interface A1 between the flat sensor layer 21 and a flat conductor 50. FIGS. 4C and 5C curved (partial cylindrical) interface A1 with correspondingly curved conductor 50c and sensor 21c configurations. FIGS. 4B and 5B show a sensor-conductor interface using a flat conductor 50 and an arc of a cylinder for the shape of the adjacent sensor layer 21c.

Figure 6:
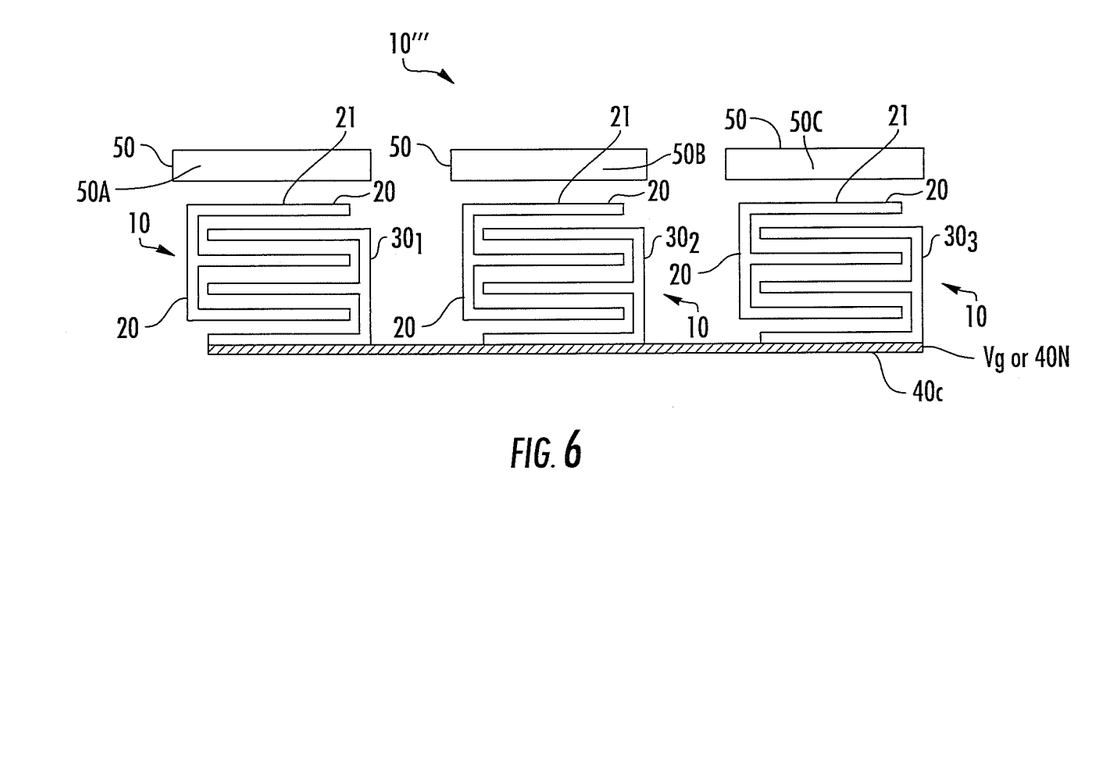
FIG. 6 is a schematic enlarged view of another exemplary multi-layer voltage sensor configuration which comprises a synthesized neutral according to embodiments of the present invention.

FIG. 6 illustrates yet another embodiment of a capacitor-divider voltage sensor 10'''. In this embodiment, the sensor 10''' has a 3-phase capacitor divider configuration with individual sensors 10 (such as shown in FIG. 2B) with an optional synthesized neutral 40N. The ground layer 30 for each capacitor divider for each phase (50A, 50B, 50C, respectively) can be connected using a conductive connection 40c such as a wire, plate or layer to form a synthesized neutral 40N (connects the outer ground conductor layer 30o to a common neutral polarity) or may all be connected to ground, Vg=0. A synthesized neutral 40N can be configured so as to not require a connection to ground. In order to sense voltage on a phase conductor 50A, 50B, 50C, respectively, at a reduced level Vs on the sensor plate 20 of a capacitor, the cooperating ground or neutral layers 30 may be reference to a common voltage (e.g., a reference ground or node). However, in a balanced system, the sum of the 3 phases is 0 volts. Thus, the three (3) different ground/neutral bodies $30_1, 30_2, 30_3$ can be electrically connected to a common reference node 40c.

Figure 7:
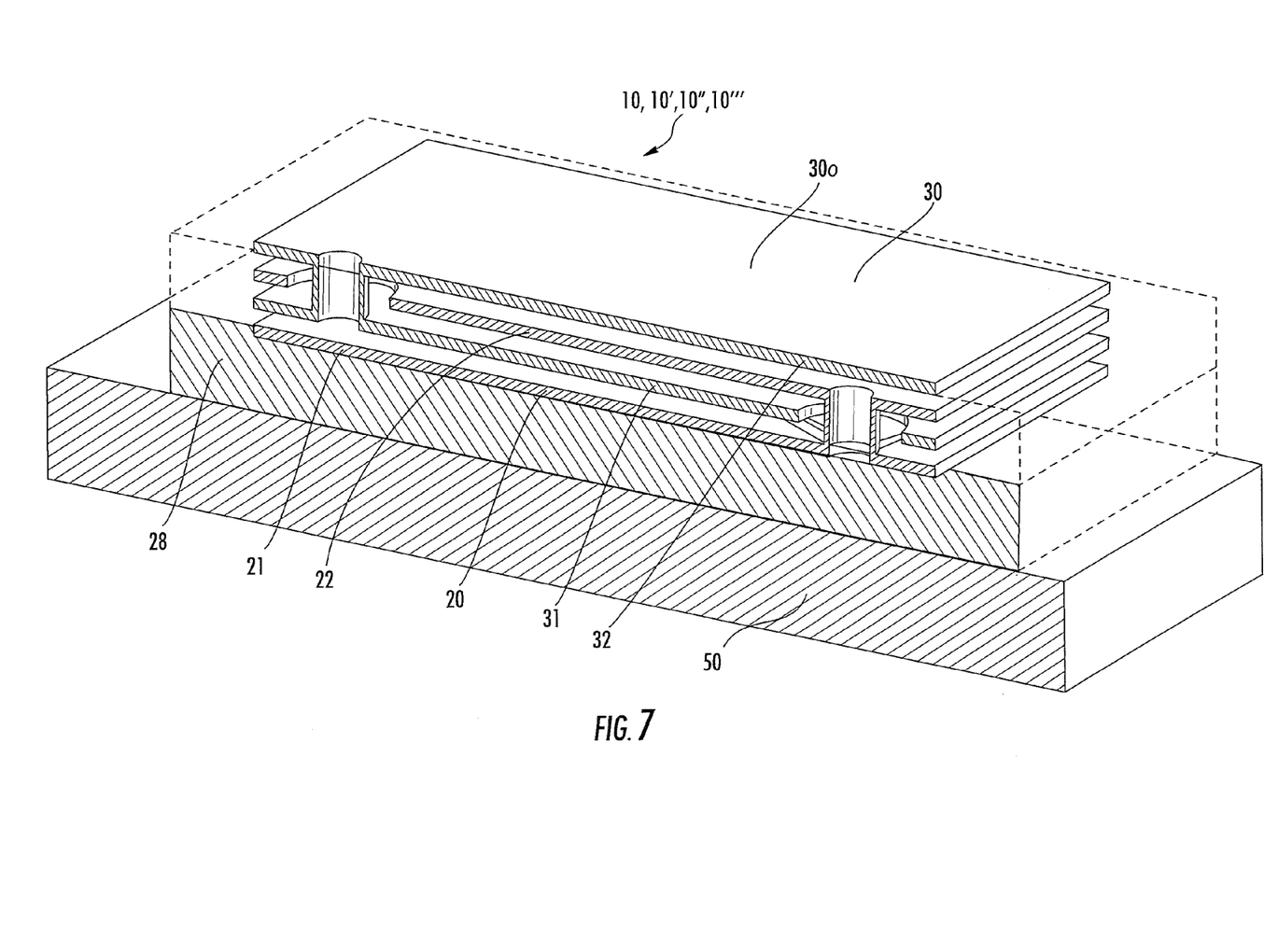
FIG. 7 is a greatly enlarged perspective view of a multi-layer voltage sensor configuration according to embodiments of the present invention.

FIG. 7 is a greatly enlarged partial view of the interleaved layers 20, 30 of sensors 10, 10', 10", 10''' and line conductor 50 with the voltage $V_R$ to be detected by the respective capacitor-divider voltage sensors.

The multi-layer voltage sensors 10, 10', 10", 10''' can be compact with closely spaced apart adjacent layers typically spaced apart a distance between about 0.001 mm to about 1 mm. The sensors 10, 10', 10", 10''' can be configured to define a compact sensor body package that has a width, length and depth dimensions of about 10 mm×10 mm×3 mm.

The sensors 10, 10', 10", 10''' can be particularly suitable for low voltage switchgear. The sensors 10, 10', 10", 10''' may be used for some medium voltage switchgears. Low voltage switchgear are typically rated below 1000 volts. Medium voltage switchgear are rated between 1000 volts and 72,500 volts. Exemplary design factors for embodiments of the invention were sized for a maximum voltage of about 2,000 volts. Spacing, sizing and/or electrical insulation may be adjusted to maintain the integrity of the electrical insulation at higher voltages to prevent dielectric breakdown.

Referring again to FIG. 8A, a circuit 100c has a PCB 100 with a voltage sensor 10, 10', 10", 10''' having a multi-layer sensor body 10b formed therein or residing thereon. The circuit 100c can communicate with at least one external device 101 (such as a trip unit 101t, FIG. 2C). The circuit 100c can optionally include a processor 100p with pre-amplifiers and other components held by or in communication with the voltage sensor 10, 10', 10", 10'''.

In some embodiments, a (e.g., readout) circuit 100c having a contact can be attached to the PCB 100. A sensor wire and/or conductive via 100w can electrically connect the conductive sensor layers 20 to the contact. A ground wire 10g can electrically ground the ground layers 30 and an optional shield. The circuit 100c can buffer the high impedance of voltage sensor 10, 10', 10", 10''' and can include buffer and amplifier circuit components to amplify voltage Vs for a voltage sensor output. Because dielectric constants are temperature sensitive, a thermocouple and a microprocessor 100p may also be included on circuit 100c to compensate for temperature variation.

Figure 9:
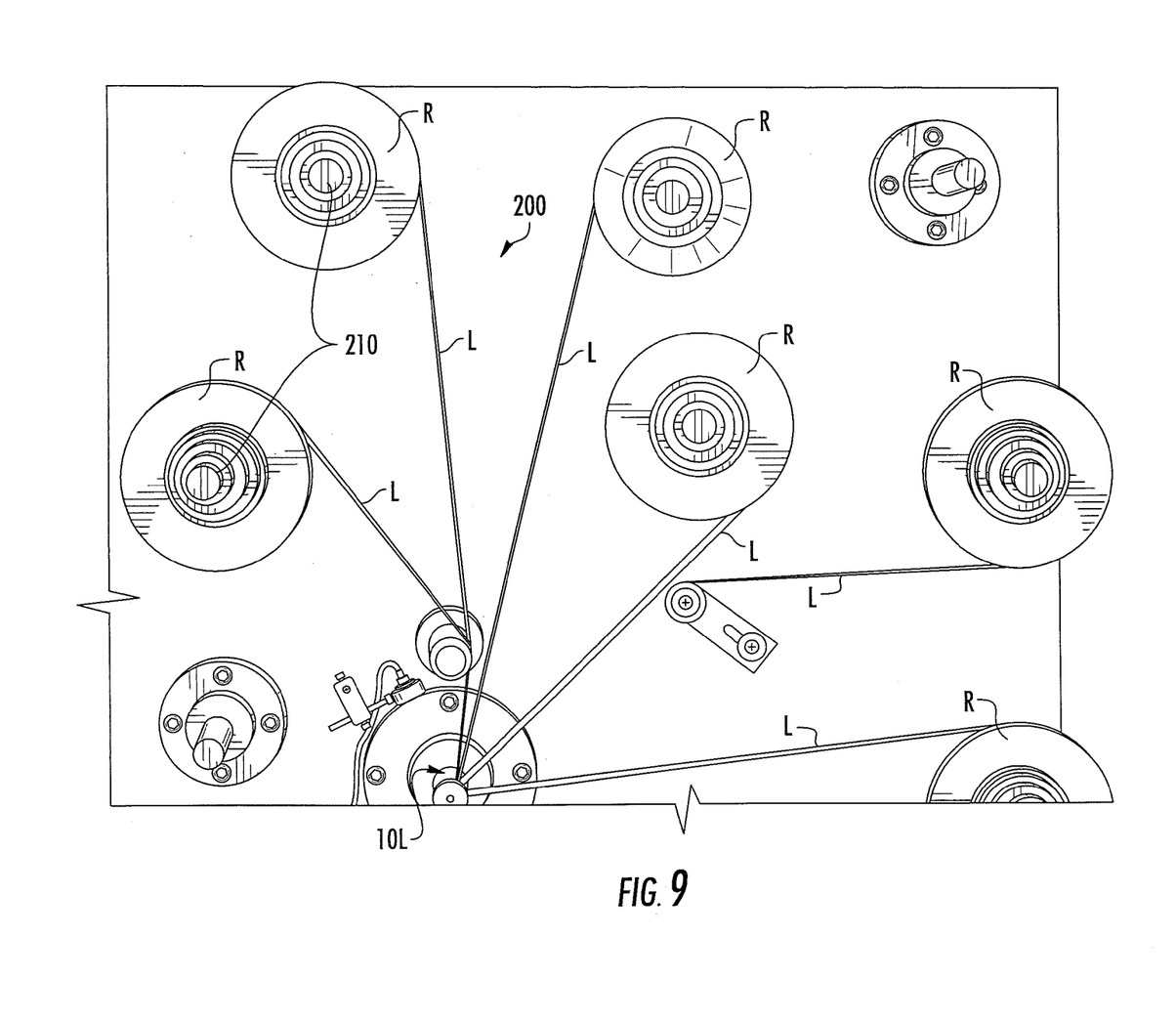
FIG. 9 is a front view of an exemplary winding apparatus that can be used for fabricating a multilayer capacitor for use as a voltage sensor according to embodiments of the present invention.

FIG. 9 illustrates an exemplary roll-mill machine 200 for forming capacitors for capacitor voltage sensors according to some embodiments of the present invention. The number of rolls R are by way of example only as different numbers of rolls R may be used (more or less) than that shown. The rolls R are held by rods or shafts 210 and are rolls of conductive and insulator material forming abutting layers L that are compressed as they are joined together to form a body of overlying abutting layers 10L. The rolls R can include conductive foil and insulator film or dielectric. The machine is a capacitor roll-mill. As shown, the machine holds six rolls R, for a 6-layer sensor 10, 10', 10", 10''', roll-mill process. It is contemplated that a four or five roll R configuration can be used to form a 4-layer or 5-layer voltage sensor configuration to get a uniform layer of dielectric between the metal foil layers. Alternatively or additionally, the machine may be configured to use roller coating methods for liquid slurries.

Figure 10:
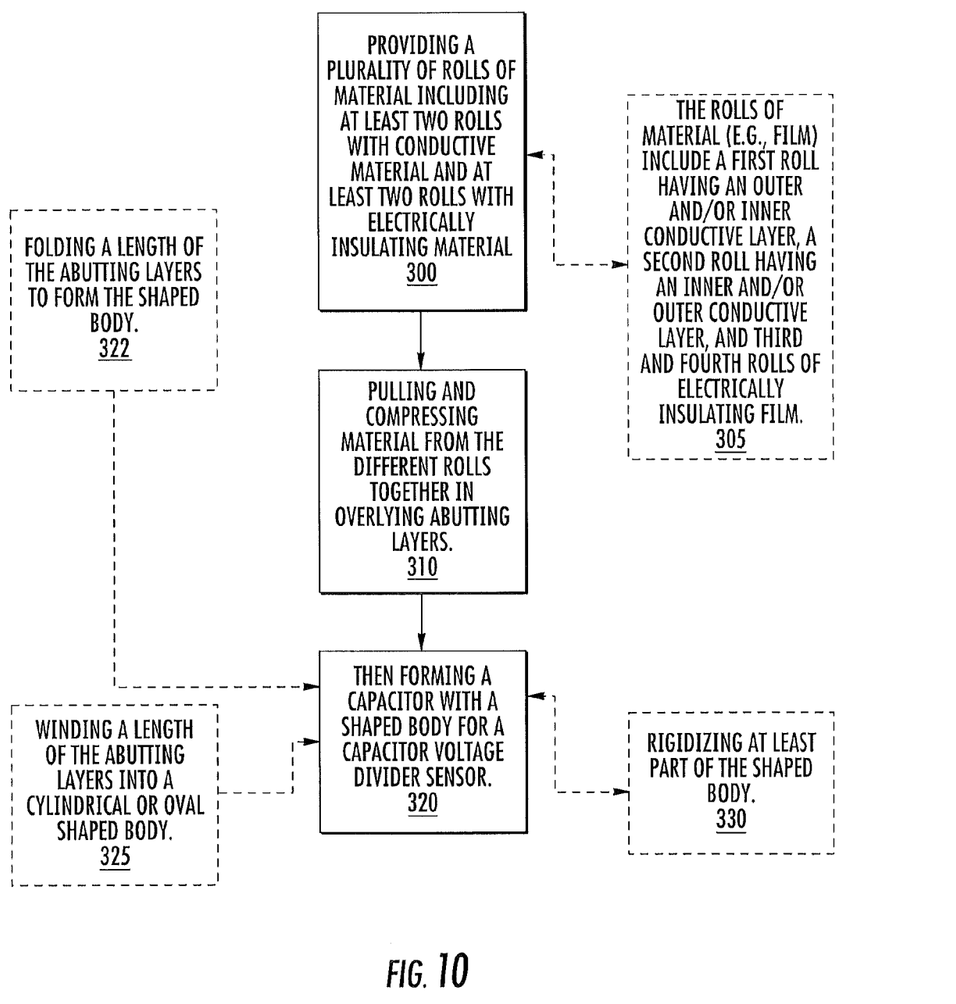
FIG. 10 is flow chart of an exemplary method of forming a voltage sensor according to embodiments of the present invention.

FIG. 10 is a flow chart of steps/actions that can be used to form capacitor voltage sensors according to some particular embodiments of the present invention. To be clear, other voltage capacitor sensor fabrication methods and machines may be used to form embodiments of the capacitor voltage sensors described herein and/or contemplated by embodiments of the invention. The broken line perimeter of boxes in FIG. 10 indicates optional features/steps/actions.

A plurality of rolls of material can be placed on respective rods, including at least two conductive material rolls and two electrical insulator material rolls (block 300). In some embodiments, the conductive material roll(s) comprises conductive foil which may itself be a single layer or multi-layer material of conductive and insulating material or only conductive material.

The rolls of material can include a first roll and a second roll of conductive material (e.g., film), each having an outer and/or inner conductive layer and third and fourth rolls of electrical insulator material (block 305).

Material from the rolls can be pulled and compressed together to form overlying abutting (attached) layers (block 310). Capacitors with a shaped body for capacitor voltages sensors can be formed using lengths of the abutting layers (block 320).

A length of the abutting layers can be folded one or more times to form the shaped body (block 322).

A length of the abutting layers can be wound one or more times to form the shaped body (block 325). The shaped body can be an oval or cylinder configured with a voltage sensor conductive layer that is configured to reside adjacent a conductor to have a planar or curved shape.

Optionally, at least part of the shaped body can be rigidized (block 330).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A capacitor divider voltage sensor, comprising: a plurality of voltage sensor conductive layers having sensor to ground interface surfaces, wherein respective voltage sensor conductive layers are electrically connected to each other and a sensor output voltage Vs; and a plurality of conductive ground layers connected to electrical ground, the conductive ground layers interleaved with the voltage sensor conductive layers so that a ground layer resides between adjacent voltage sensor conductive layers, wherein the plurality of voltage sensor conductive layers with the sensor to ground interfaces includes a first voltage sensor layer that is closest to a line conductor, wherein the first voltage sensor layer has a sensor to conductor interface surface facing the line conductor with a corresponding interface area and also has the sensor to ground interface on an opposing primary surface, wherein the first voltage sensor layer is separated from the line conductor by at least one dielectric or insulating material to reside a distance "gsc" away from the line conductor, wherein the capacitor divider voltage sensor defines a first capacitor "Csc" with capacitance from the voltage sensor to line conductor being proportional to the area of the interface surface between the first voltage sensor layer and the conductor and being inversely proportional to "gsc", wherein each voltage sensor conductive layer with the sensor to ground interface surface has a respective area and resides a distance "gsg" from a neighboring ground layer, wherein the capacitor divider voltage sensor defines a second capacitor "Csg" with capacitance from the capacitor divider voltage sensor to ground being proportional to the area of the sensor to ground interface surfaces and the number of conductive layers with respective sensor to ground interface surfaces and is inversely proportional to "gsg", and wherein the voltage sensor conductive layers and ground layers are defined by a continuous length of a flexible substrate with opposing first and second conductive surfaces separated by a dielectric film, the first conductive surface forming the voltage sensor conductive layers and the second conductive surface forming the conductive ground layers.

2. The sensor of claim 1, wherein the capacitor divider voltage sensor has the same number of ground and voltage sensor layers forming sensor to ground interface surfaces.

3. The sensor of claim 1, wherein the capacitor divider voltage sensor is configured so that an outer layer is a ground layer to thereby shield the sensor from external electric fields.

4. The sensor of claim 1, wherein the first voltage sensor layer has a sensor to conductor interface surface with a corresponding surface area that is between about 1 mm2 to about 1,000 mm2.

5. A capacitor divider voltage sensor, comprising: a plurality of voltage sensor conductive layers having sensor to ground interface surfaces, wherein respective voltage sensor conductive layers are electrically connected to each other and a sensor output voltage Vs; and a plurality of conductive ground layers connected to electrical ground, the conductive ground layers interleaved with the voltage sensor conductive layers so that a ground layer resides between adjacent voltage sensor conductive layers, wherein the plurality of voltage sensor conductive layers with the sensor to ground interfaces includes a first voltage sensor layer that is closest to a line conductor, wherein the first voltage sensor layer has a sensor to conductor interface surface facing the line conductor with a corresponding interface area and also has the sensor to ground interface on an opposing primary surface, wherein the first voltage sensor layer is separated from the line conductor by at least one dielectric or insulating material to reside a distance "gsc" away from the line conductor, wherein the capacitor divider voltage sensor defines a first capacitor "Csc" with capacitance from the voltage sensor to line conductor being proportional to the area of the interface surface between the first voltage sensor layer and the conductor and being inversely proportional to "gsc", wherein each voltage sensor conductive layer with the sensor to ground interface surface has a respective area and resides a distance "gsg" from a neighboring ground layer, wherein the capacitor divider voltage sensor defines a second capacitor "Csg" with capacitance from the capacitor divider voltage sensor to ground being proportional to the area of the sensor to ground interface surfaces and the number of conductive layers with respective sensor to ground interface surfaces and is inversely proportional to "gsg", wherein the respective voltage sensor conductor layers are electrically connected by continuations of material forming the interface surfaces, and wherein the capacitor divider voltage sensor is configured so that the continuations of material of respective ground and voltage sensor conductive layers are orthogonal to the sensor to ground interface surfaces.

6. The sensor of claim 5, wherein the continuations of material and the voltage sensor layers with the sensor to ground interfaces have a common length dimension.

7. A capacitor divider voltage sensor, comprising: a plurality of voltage sensor conductive layers having sensor to ground interface surfaces, wherein respective voltage sensor conductive layers are electrically connected to each other and a sensor output voltage Vs; and a plurality of conductive ground layers connected to electrical ground, the conductive ground layers interleaved with the voltage sensor conductive layers so that a ground layer resides between adjacent voltage sensor conductive layers, wherein the plurality of voltage sensor conductive layers with the sensor to ground interfaces includes a first voltage sensor layer that is closest to a line conductor, wherein the first voltage sensor layer has a sensor to conductor interface surface facing the line conductor with a corresponding interface area and also has the sensor to ground interface on an opposing primary surface, wherein the first voltage sensor layer is separated from the line conductor by at least one dielectric or insulating material to reside a distance "gsc" away from the line conductor, wherein the capacitor divider voltage sensor defines a first capacitor "Csc" with capacitance from the voltage sensor to line conductor being proportional to the area of the interface surface between the first voltage sensor layer and the conductor and being inversely proportional to "gsc", wherein each voltage sensor conductive layer with the sensor to ground interface surface has a respective area and resides a distance "gsg" from a neighboring ground layer, wherein the capacitor divider voltage sensor defines a second capacitor "Csg" with capacitance from the capacitor divider voltage sensor to ground being proportional to the area of the sensor to ground interface surfaces and the number of conductive layers with respective sensor to ground interface surfaces and is inversely proportional to "gsg", wherein the voltage sensor conductive layers and ground layers are defined by a flexible substrate with opposing first and second conductive surfaces separated by a dielectric film, the first conductive surface forming the voltage sensor conductive layers and the second conductive surface forming the conductive ground layers, and wherein the film thickness defines the distance gsg between adjacent conductive voltage sensor and conductor layers.

8. The sensor of claim 7, wherein the flexible substrate is folded into a plurality of closely spaced apart stacked sections.

9. The sensor of claim 7, wherein the flexible substrate has a body with a serpentine or undulation shape, the extensions defined by bends associated with the folds, and wherein the flexible substrate holds an electronic circuit with an amplifier to amplify sensor voltage Vs from the voltage sensor.

10. The sensor of claim 9, wherein at least one region of the flexible substrate has increased rigidity with respect to other regions and holds the electronic circuit.

11. A capacitor divider voltage sensor, comprising: a plurality of voltage sensor conductive layers having sensor to ground interface surfaces, wherein respective voltage sensor conductive layers are electrically connected to each other and a sensor output voltage Vs; and a plurality of conductive ground layers connected to electrical ground, the conductive ground layers interleaved with the voltage sensor conductive layers so that a ground layer resides between adjacent voltage sensor conductive layers, wherein the plurality of voltage sensor conductive layers with the sensor to ground interfaces includes a first voltage sensor layer that is closest to a line conductor, wherein the first voltage sensor layer has a sensor to conductor interface surface facing the line conductor with a corresponding interface area and also has the sensor to ground interface on an opposing primary surface, wherein the first voltage sensor layer is separated from the line conductor by at least one dielectric or insulating material to reside a distance "gsc" away from the line conductor, wherein the capacitor divider voltage sensor defines a first capacitor "Csc" with capacitance from the voltage sensor to line conductor being proportional to the area of the interface surface between the first voltage sensor layer and the conductor and being inversely proportional to "gsc", wherein each voltage sensor conductive layer with the sensor to ground interface surface has a respective area and resides a distance "gsg" from a neighboring ground layer, wherein the capacitor divider voltage sensor defines a second capacitor "Csg" with capacitance from the capacitor divider voltage sensor to ground being proportional to the area of the sensor to ground interface surfaces and the number of conductive layers with respective sensor to ground interface surfaces and is inversely proportional to "gsg", wherein the voltage sensor conductive layers and the conductive ground layers are defined by a flexible substrate with opposing first and second conductive surfaces, the first conductive surface forming the voltage sensor conductive layers and the second conductive surface forming the ground layers, wherein the flexible substrate has a rolled or wound body capacitor divider configuration with stacked layers in a spiral cylindrical shape or an oval shape.

12. The sensor of claim 11, wherein the first voltage sensor layer has a planar conductor to voltage sensor interface surface.

13. The sensor of claim 11, wherein the first voltage sensor layer has a curved conductor to sensor interface surface.

14. The sensor of claim 11, wherein the flexible substrate comprises at least four layers in a defined order of, an outer dielectric layer, a respective voltage sensor conductive layer, a second dielectric film, and a respective conductive ground layer.

15. A multi-phase capacitor divider voltage sensor, comprising: a plurality of multi-layer voltage sensors, each multi-layer voltage sensor having (i) interleaved conductive sensor and ground layers configured to have a first conductive voltage sensor layer that faces a respective line conductor and is electrically connected to the other voltage sensor layers and (ii) an outer conductive ground layer, wherein the conductive outer ground layer of each of the multi-layer voltage sensors is electrically connected to a common reference node, and wherein the plurality of multi-layer voltage sensors comprise first, second and third multi-layer voltage sensors, each connected to a different phase conductor.

16. The sensor of claim 15, further comprising a conductive plate, PCB or flex circuit or wire that electrically connects the outer conductive ground layer of the plurality of multi-layer voltage sensors.

17. The sensor of claim 15, wherein the outer conductive ground layers are electrically connected at a neutral polarity to define a synthesized neutral.

18. A circuit for a low or medium voltage switchgear, comprising one or more of the following capacitor divider voltage sensor configurations:
(i) a capacitor divider voltage sensor, comprising:
a plurality of voltage sensor conductive layers having sensor to ground interface surfaces, wherein respective voltage sensor conductive layers are connected by continuations of material forming the interface surfaces; and
a plurality of conductive ground layers, the ground layers interleaved with the voltage sensor conductive layers so that a conductive ground layer resides between adjacent voltage sensor conductive layers, wherein the plurality of voltage sensor conductive layers with the sensor to ground interfaces includes a first voltage sensor conductive layer that is closest to a line conductor and is electrically connected to sensor output Vs, the first voltage sensor conductive layer has a sensor to conductor interface surface with a corresponding interface area, wherein the first voltage sensor conductive layer is separated from the line conductor by at least one dielectric or insulating material to reside a distance "gsc" away from the line conductor, wherein the capacitor divider voltage sensor defines a first capacitor "Csc" with capacitance being proportional to an area of the interface surface between the first voltage sensor conductive layer and the line conductor and being inversely proportional to "gsc", wherein each voltage sensor conductive layer with a respective sensor to ground interface surface resides a distance "gsg" from a neighboring ground layer, wherein capacitance from a second capacitor of the capacitor divider voltage sensor to ground "Csg" is proportional to the area of the interface surfaces and the number of conductive layers with sensor to ground interface surfaces and is inversely proportional to "gsg", wherein the capacitor divider voltage sensor is configured so that an outer layer is a ground layer connected to Vg to thereby shield the capacitor divider voltage sensor from external electric fields;

(ii) a capacitor divider voltage sensor having a flexible substrate body with a length that is folded a plurality of times and defines spaced apart conductive sensor and ground layers separated by a dielectric film, wherein the capacitor divider voltage sensor is configured so that a first conductive sensor layer faces a respective line conductor and is electrically connected to sensor output Vs;

(iii) a capacitor divider voltage sensor having a flexible substrate body with a length that is rolled to form a substantially cylindrical or oval body with stacked conductive sensor and ground layers separated by a dielectric film, wherein the capacitor divider voltage sensor is configured so that a first conductive sensor layer faces a respective line conductor and is electrically connected to sensor output Vs; or (iv) a plurality of multi-layer voltage sensors, each multi-layer voltage sensor having (i) interleaved conductive voltage sensor and ground layers configured to have a first conductive voltage sensor layer that faces a respective line conductor and is electrically connected to the other voltage sensor layers and (ii) an outer conductive ground layer, wherein the outer conductive ground layers of each of the multi-layer voltage sensors are electrically connected at a common reference node.

* * * * *